United States Patent
Doris et al.

(10) Patent No.: US 8,569,844 B2
(45) Date of Patent: Oct. 29, 2013

(54) METAL GATE CMOS WITH AT LEAST A SINGLE GATE METAL AND DUAL GATE DIELECTRICS

(75) Inventors: Bruce B. Doris, Brewster, NY (US); Young-Hee Kim, Yorktown Heights, NY (US); Barry P. Linder, Hastings-on-Hudson, NY (US); Vijay Narayanan, New York, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 977 days.

(21) Appl. No.: 12/211,649

(22) Filed: Sep. 16, 2008

(65) Prior Publication Data

US 2009/0008720 A1    Jan. 8, 2009

Related U.S. Application Data

(62) Division of application No. 11/320,330, filed on Dec. 28, 2005, now Pat. No. 7,432,567.

(51) Int. Cl.
*H01L 31/119* (2006.01)
(52) U.S. Cl.
USPC ..... 257/407; 257/369; 257/412; 257/E21.637
(58) Field of Classification Search
USPC ............... 257/407, 369, 412, E21.637
See application file for complete search history.

(56) References Cited

U.S. PATENT DOCUMENTS

| | | | |
|---|---|---|---|
| 6,686,282 B1 | 2/2004 | Simpson et al. | |
| 7,432,567 B2 * | 10/2008 | Doris et al. | 257/407 |
| 2004/0256700 A1 | 12/2004 | Ieong et al. | |
| 2005/0093104 A1 | 5/2005 | Ieong et al. | |
| 2005/0116290 A1 | 6/2005 | de Souza et al. | |
| 2005/0233562 A1 | 10/2005 | Adetutu et al. | |
| 2006/0118879 A1 | 6/2006 | Li | |
| 2006/0131652 A1 | 6/2006 | Li | |
| 2006/0246740 A1 | 11/2006 | Cartier et al. | |
| 2006/0270239 A1 | 11/2006 | Triyoso et al. | |

* cited by examiner

*Primary Examiner* — Long Pham
(74) *Attorney, Agent, or Firm* — Scully, Scott, Murphy & Presser, P.C.; Louis J. Percello, Esq.

(57) ABSTRACT

A complementary metal oxide semiconductor (CMOS) structure including at least one nFET and at least one pFET located on a surface of a semiconductor substrate is provided. In accordance with the present invention, the nFET and the pFET both include at least a single gate metal and the nFET gate stack is engineered to have a gate dielectric stack having no net negative charge and the pFET gate stack is engineered to have a gate dielectric stack having no net positive charge. In particularly, the present invention provides a CMOS structure in which the nFET gate stack is engineered to include a band edge workfunction and the pFET gate stack is engineered to have a ¼ gap workfunction. In one embodiment of the present invention, the first gate dielectric stack includes a first high k dielectric and an alkaline earth metal-containing layer or a rare earth metal-containing layer, while the second high k gate dielectric stack comprises a second high k dielectric.

8 Claims, 15 Drawing Sheets

METAL GATE CMOS WITH AT LEAST A SINGLE GATE METAL AND DUAL GATE DIELECTRICS

RELATED APPLICATION

This application is a divisional of U.S. patent application Ser. No. 11/320,330, filed Dec. 28, 2005.

FIELD OF THE INVENTION

The present invention relates to a semiconductor structure, and more particularly to a complementary metal oxide semiconductor (CMOS) structure including at least one nFET and at least one pFET located on a surface of a semiconductor substrate. In accordance with the present invention, the nFET and the pFET both include at least a single gate metal and the nFET gate stack is engineered to have a gate dielectric stack that has no net negative charge, and the pFET gate stack is engineered to have a gate dielectric stack that has no net positive charge. The present invention also provides a method of forming such a CMOS structure.

BACKGROUND OF THE INVENTION

In current complementary metal oxide semiconductor (CMOS) technology, a polysilicon gate is typically employed. One disadvantage of utilizing polysilicon gates is that at inversion the polysilicon gates generally experience depletion of carriers in the area of the polysilicon gate that is adjacent to the gate dielectric. This depletion of carriers is referred to in the art as the polysilicon depletion effect. The depletion effect reduces the effective gate capacitance of the CMOS device. Ideally, it is desirable that the gate capacitance of the CMOS device be high since high gate capacitance typically equates to more charge being accumulated in the inversion layer. As more charge is accumulated in the channel, the source/drain current becomes higher when the transistor is biased.

CMOS devices including a gate stack comprising a bottom polysilicon portion and a top silicide portion are also known. The layer of silicide in such a gate stack contributes to a decrease in the resistance of the gate. The decrease in resistance causes a decrease in the time propagation delay RC of the gate. Although a silicide top gate region may help decrease the resistance of the transistor, charge is still depleted in the vicinity of the interface formed between the bottom polysilicon gate and gate dielectric, thereby causing a smaller effective gate capacitance.

Another type of CMOS device that is available is one where the gate electrode includes at least a metal layer beneath a Si-containing, e.g., polysilicon, gate electrode. In such CMOS devices, the metal of the gate prevents depletion of charge through the gate. This prevents the decrease in effective thickness of the gate capacitance. Although metal-gated devices address the depletion problem mentioned above in regard to polysilicon gates, it is difficult to obtain nFET and pFET workfunctions using metal-gated devices due to instability in threshold voltage. This is especially the case when high k dielectrics such as Hf-based dielectrics are used as the gate dielectric of metal-gated devices.

In view of the above, and in order to continue the CMOS scaling trend using metal gate stacks, there is a need to provide a CMOS structure in which at least one of the metal gate stacks has an nFET workfunction and at least one other metal gate has a pFET workfunction. It is noted that the term "workfunction" as used herein refers to the effective workfunction of the dielectric stack and the gate electrode.

SUMMARY OF THE INVENTION

The present invention provides a complementary metal oxide semiconductor (CMOS) structure including at least one nFET and at least one pFET located on a surface of a semiconductor substrate. In accordance with the present invention, the nFET and the pFET both include at least a single gate metal and the nFET gate stack is engineered to have a gate dielectric stack having no net negative charge and the pFET gate stack is engineered to have a gate dielectric stack having no net positive charge. In particularly, the present invention provides a CMOS structure in which the nFET gate stack is engineered to include a band edge workfunction and the pFET gate stack is engineered to have a ¼ gap workfunction.

In broad terms, the present invention provides a semiconductor structure comprising:
a semiconductor substrate including at least one nFET device region and at least one pFET device region, said device regions are separated by an isolation region;
a first gate dielectric stack having a net dielectric constant greater than silicon dioxide located on a surface of said substrate and within said at least one nFET device region;
a second gate dielectric stack having a net dielectric constant greater than silicon dioxide located on a surface of said substrate and within said at least one pFET device region, wherein said first gate dielectric stack is different from said second gate dielectric stack and wherein said first gate dielectric stack contains no net negative charge and said second gate dielectric stack contains no net positive charge; and
a single metal layer located on said first gate dielectric stack and said second gate dielectric stack.

In accordance with one embodiment of the present invention, the first gate dielectric stack includes a first high k dielectric and an alkaline earth metal-containing layer or a rare earth metal (or a rare earth-like) containing layer, while the second gate dielectric stack comprises a second high k dielectric. These materials are defined in greater detail herein below. In yet another embodiment, the first gate dielectric stack includes an interfacial layer, while the interfacial layer is absent from the second gate dielectric stack. In still another embodiment of the present invention, the interfacial layer is present in both the first and second gate dielectric stacks.

In a further embodiment of the present invention, a second metal layer can be located atop the single metal layer in one of the device regions.

In a highly preferred embodiment of the present invention, a semiconductor structure is provided that comprises:
a semiconductor substrate including at least one nFET device region and at least one pFET device region, said device regions are separated by an isolation region;
at least one gate stack within said at least one nFET device region that comprises, from bottom to top, an interfacial layer, a $HfO_2/MgO$ or $HfO_2/La_2O_3$ gate dielectric, TiN, and polySi; and
at least one gate stack within said at least one pFET device region that comprises, from bottom to top, an $Al_2O_3$ or AlN gate dielectric, TiN, and polySi.

In addition to the semiconductor structure described above, the present invention also provides a method of fabricating such a structure. In broad terms, the method of the present invention comprises:
providing a structure comprising a semiconductor substrate including at least one nFET device region and at least one pFET device region, said device regions are separated by an isolation region and said at least one nFET device region includes a first gate dielectric stack having a net dielectric constant greater than silicon dioxide located on a surface of said substrate and said at least one pFET device region has a second gate dielectric stack having a net dielectric constant greater than silicon dioxide located on a surface of said substrate, said first gate dielectric stack is different from said second gate dielectric stack and said first gate dielectric stack contains no net negative charge and said second gate dielectric stack contains no net positive charge; and forming a first metal on said first and second gate dielectric stacks.

DETAILED DISCUSSION OF THE DRAWINGS

Figure 1A:
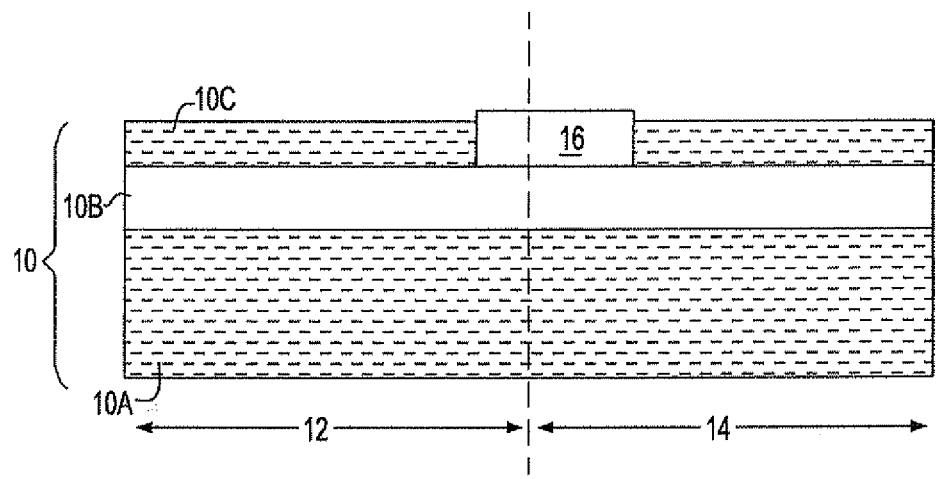
FIGS. 1A-1N are pictorial representations (through cross sectional views) depicting the basic processing steps employed in the present invention for fabricating a semiconductor structure including dual gate dielectrics and at least a single gate metal.

The present invention, which provides a semiconductor structure with at least a single gate metal and dual gate dielectrics as well as a method of forming the same, will now be described in greater detail by referring to the following discussion and drawings that accompany the present application. It is noted that the drawings of the present application are provided for illustrative purposes and, as such, the drawings are not drawn to scale. Also, like and/or corresponding elements are referred to herein using like reference numerals. It is further noted that the present invention provides means for tuning the gate stack to have appropriate workfunctions for use as an nFET device and a pFET device.

The method of the present invention will now be described in greater detail by referring to FIGS. 1A-1N. It is noted that these drawings show a fragment of a semiconductor substrate including a single nFET device region and a single pFET device region. Although such an embodiment is specifically shown and described, the present invention is not limited to a single region for the pFET devices and the nFET devices, but instead contemplates a plurality of each of such device regions located throughout the remaining portions of the substrate. Also, more than one nFET device and pFET device can be formed in the corresponding device region.

Reference is first made to FIG. 1A which shows an initial structure that is employed in the present invention. The initial structure includes a semiconductor substrate 10 comprising at least one nFET device region 12 (i.e., an area of the substrate 10 in which nFETs will be subsequently formed) and at least one pFET device region 14 (i.e., an area of the substrate 10 in which pFETs will be subsequently formed). In accordance with the present invention, the at least one nFET device region 12 and the at least one pFET device region 14 are separated (in the lateral direction) by an isolation region 16.

The semiconductor substrate 10 of the initial structure shown in FIG. 1A comprises any semiconducting material including, but not limited to: Si, Ge, SiGe, SiC, SiGeC, GaAs, GaN, INAs, InP and all other III/V or II/VI compound semiconductors. Semiconductor substrate 10 may also comprise an organic semiconductor or a layered semiconductor such as Si/SiGe, or a semiconductor-on-insulator (SOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques such as described, for example, in U.S. Ser. No. 10/250,241, filed Jun. 17, 2003, now U.S. Pat. No. 7,329,923, U.S. Ser. No. 10/725,850, filed Dec. 2, 2003, now U.S. Patent Publication No. 2005/0116290, and U.S. Ser. No. 10/696,634, filed Oct. 29, 2003, now U.S. Pat. No. 7,023,055, the entire contents of each are incorporated herein by reference.

It is noted that in the drawings of the present invention, an SOI substrate including a bottom semiconductor layer 10A and a top semiconductor layer 10C that are separated by a buried insulating layer 10B is depicted for illustrative proposes and that this depiction in no way suggests that the invention is limited to such an embodiment. Instead, bulk semiconductors as mentioned above are also contemplated as well as other layered semiconductors. In the illustration, the top and bottom semiconductor layers, 10C and 10A, respectively, comprise one of the aforementioned semiconductor materials, while the buried insulating layer 10B is comprised of a crystalline or non-crystalline oxide, nitride or oxynitride. The SOI substrates can be formed utilizing standard processes well known in the art including, for example, a layer transfer process or SIMOX (separation by ion implantation of oxygen).

The semiconductor substrate 10 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region 16 is then typically formed into the semiconductor substrate 10. The isolation region 16 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The depth of the trench used in forming the trench isolation region may vary and is not critical to the present invention. For example, the depth of the trench can extend to the surface of the buried insulating layer 10B when an SOI substrate is used, it can also extend entirely through the buried insulating layer 10B when an SOI substrate is used, or it can extend only through a portion of the top semiconductor layer 10C when an SOI substrate is used. The field oxide may be formed utilizing a so-called local oxidation of silicon process. Note that the at least one isolation region 16 provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type). The later case is shown in the drawings of the present application.

After processing the semiconductor substrate 10, an interfacial layer (not shown) is optionally formed on the surface of the semiconductor substrate 10 by chemical oxidation. The optional interfacial layer is formed utilizing a conventional wet chemical process technique that is well known to those skilled in the art. Alternatively, the interfacial layer may be formed by thermal oxidation, oxynitridation or by vapor deposition. When the substrate 10 is a Si-containing semiconductor, the interfacial layer is comprised of chemical oxide grown by wet processing, or thermally grown or deposited silicon oxide, silicon oxynitride or a nitrided silicon oxide. When the substrate 10 is other than a Si-containing semiconductor, the interfacial layer may comprise a semiconducting oxide, a semiconducting oxynitride or a nitrided semiconducting oxide or any other interface dielectric such as, for example, one having a low interface trap density with the semiconducting material.

The thickness of the interfacial layer is typically from about 0.4 to about 1.2 nm, with a thickness from about 0.6 to about 1 nm being more typical. The thickness, however, may be different after processing at higher temperatures, which are usually required during CMOS fabrication.

In accordance with an embodiment of the present invention, the interfacial layer is a silicon oxide layer having a thickness from about 0.6 to about 1.0 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the interfacial layer can also be formed by treating the HF-last semiconductor surface in ozonated aqueous solutions, with the ozone concentration usually varying from, but not limited to: 2 parts per million (ppm) to 40 ppm.

Figure 1B:
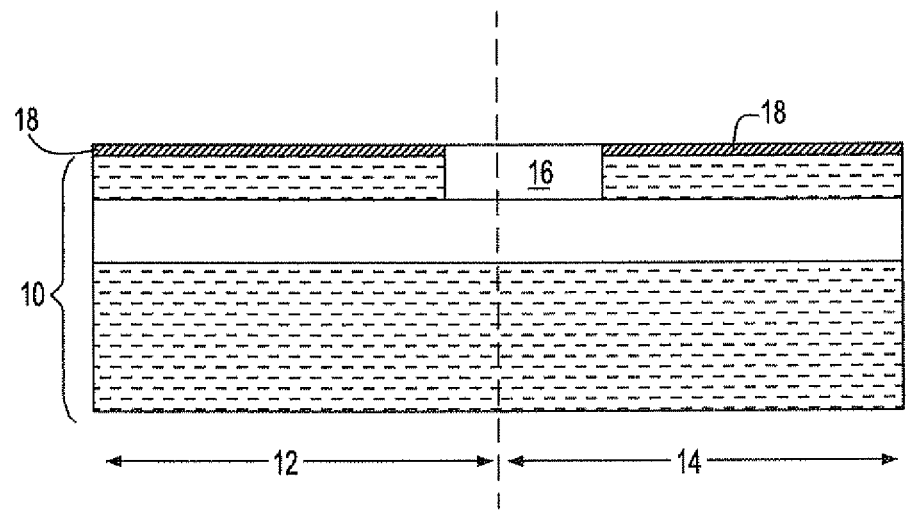

Next, and as is shown in FIG. 1B, a first high k dielectric 18, which is used in the present invention as part of the gate dielectric stack for an nFET device, is formed on the surface of the interfacial layer, if present, or the surface of the semiconductor substrate 10 by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. It is noted that in this step of the present invention, the first high k dielectric 18 is formed in both the device regions. In some embodiments, the first high k dielectric 18 can be formed atop the isolation region as well. The first high k dielectric 18 may also be formed utilizing any combination of the above processes.

The first high k dielectric 18 employed in the present invention is any dielectric material having a dielectric constant of greater than about 4.0, typically greater than about 7.0 that is typically used with an nFET device. Note that silicon dioxide has a dielectric constant of 4.0 and, as such, the present invention contemplates any dielectric whose dielectric constant is greater than that of silicon dioxide. The first high k dielectric 18 is typically a metal oxide or mixed metal oxide that is used with nFET devices. Illustrative examples of such high k dielectrics include, but are not limited: $TiO_2$, $La_2O_3$, $SrTiO_3$, $LaAlO_3$, $ZrO_2$, $Y_2O_3$, $Gd_2O_3$, MgO, MgNO, Hf-based dielectrics (to be described in greater detail herein below), and combinations including multilayers thereof. Preferably, the first high k dielectric 18 is a Hf-based dielectric.

The term 'Hf-based dielectric' is intended herein to include any high k dielectric containing hafnium, Hf. Examples of such Hf-based dielectrics comprise hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$ or rare earth oxide such as $La_2O_3$. MgO or MgNO can also be used. Typically, the Hf-based dielectric is hafnium oxide or hafnium silicate. Hf-based dielectrics typically have a dielectric constant that is greater than about 10.0.

The physical thickness of the first high k dielectric 18 may vary, but typically, the first high k dielectric 18 has a thickness from about 0.5 to about 10 nm, with a thickness from about 0.5 to about 3 nm being more typical.

In one embodiment of the present invention, the first high k dielectric 18 is hafnium oxide that is formed by MOCVD were a flow rate of about 70 to about 90 mgm of hafnium-tetrabutoxide (a Hf-precursor) and a flow rate of $O_2$ of about 250 to about 350 seem are used. The deposition of Hf oxide occurs using a chamber pressure between 0.3 and 0.5 Torr and a substrate temperature of between 400° and 500° C.

In another embodiment of the present invention, the first high k dielectric 18 is hafnium silicate which is formed by MOCVD using the following conditions (i) a flow rate of the precursor Hf-tetrabutoxide of between 70 and 90 mg/m, a flow rate of $O_2$ between 25 and 100 sccm, and a flow rate of $SiH_4$ of between 20 and 60 sccm; (ii) a chamber pressure between 0.3 and 0.5 Torr, and (iii) a substrate temperature between 400° and 500° C.

Figure 1C:
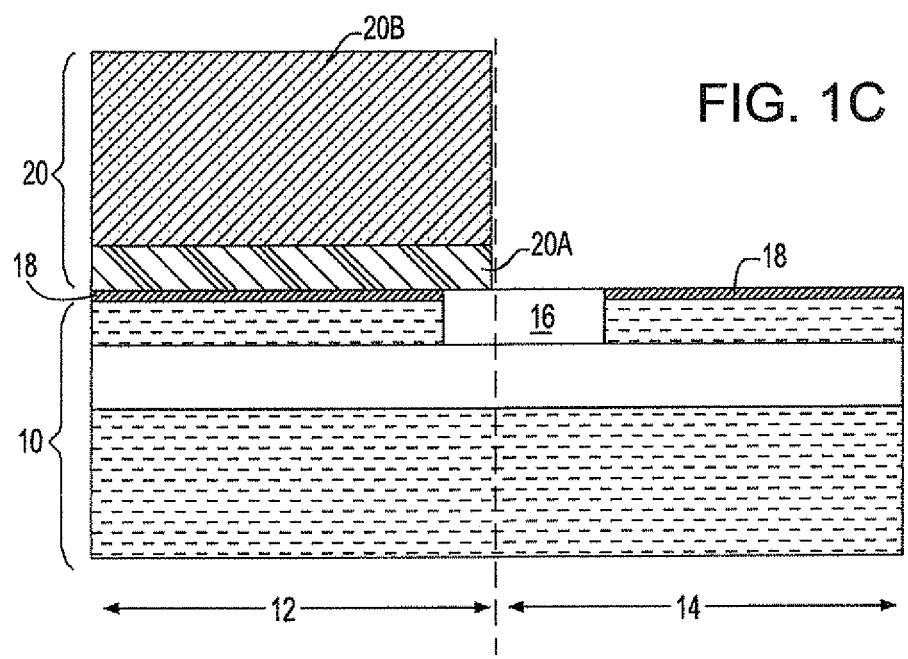

Next, and as shown in FIG. 1C, a first patterned block mask 20 is formed within the nFET device region 12. In accordance with the present invention, the first patterned block mask 20 includes a block mask material layer 20B and a developable ARC (antireflective coating) layer 20A. The block mask material layer 20B comprises an organic photoresist material and the developable ARC layer 20A comprises an organic coating that has antireflective properties. The first patterned block mask 20 is formed by deposition of layer 20A and then layer 20B utilizing a conventional deposition process such as, for example, spin-on coating, chemical vapor deposition, plasma enhanced chemical vapor deposition, dip coating, and the like. Lithography is then used in patterning the blanket deposited layers forming the first patterned block mask 20 within the nFET region 12. The lithographic step includes exposing the layers to a pattern of radiation and developing the exposed layers.

Figure 1D:
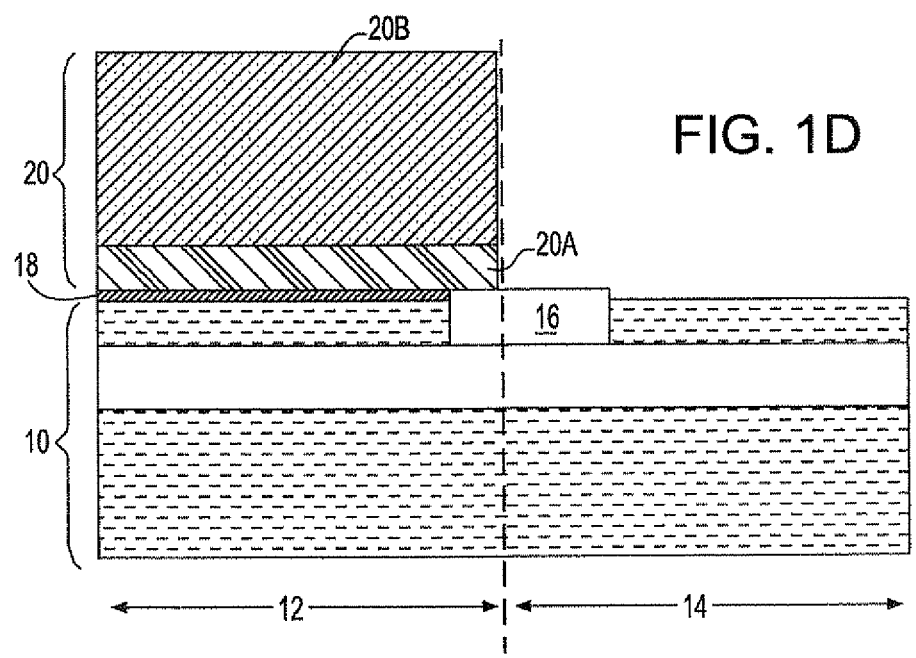

As is shown in FIG. 1C, the first high k dielectric 18 within the pFET device region 14 is exposed, while the first patterned block mask 20 protects the first high k dielectric 18 within the nFET device region 12. Next, the exposed first high k dielectric 18 within the pFET device region 14 is removed utilizing a wet chemical etching process so as to expose the surface of the semiconductor substrate 10. Note that during this step of the present invention, the optional interfacial layer within the pFET device region 14 is also typically removed. The wet chemical etching process includes the use of a chemical etchant that is selective in removing dielectric material. The choice of the exact chemical etchant may vary depending on the dielectric material to be removed and its selection can be determined by one skilled in the art. The resultant structure that is formed is shown, for example, in FIG. 1D.

Figure 1E:
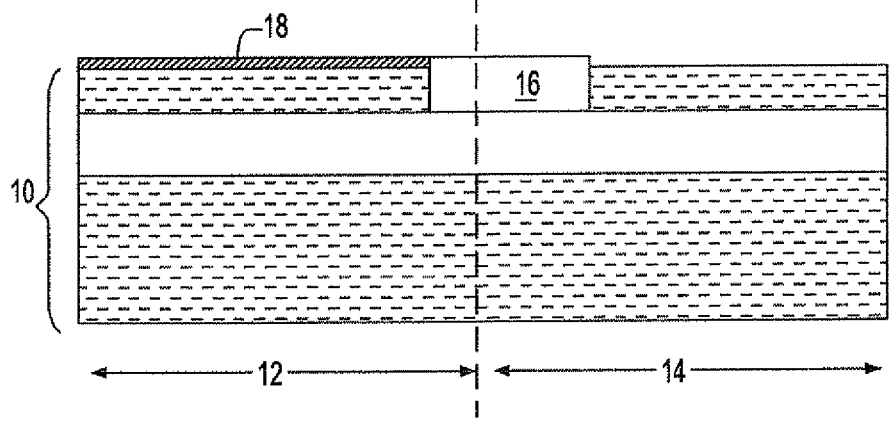

FIG. 1E shows the structure after removing the first patterned block mask 20 that was used in protecting the first high k dielectric 18 that is present within the nFET device region 12. The first patterned block mask 20 is removed utilizing a conventional stripping process that is selective with respect to the high k layer, and is well known to those skilled in the art. Note that at this point of the present invention, the nFET device region 12 includes the first high k dielectric 18, while no dielectric other than a portion of the isolation region and, optionally the interfacial layer is present within the pFET device region 14.

Figure 1F:
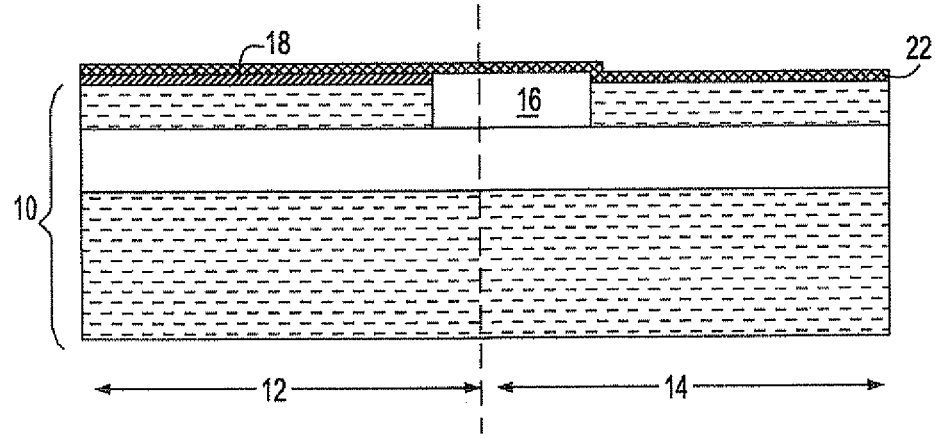

Next, a second high k dielectric 22 that is different from the first high k dielectric 18 is formed across the entire surface of the structure shown in FIG. 1E providing the structure shown, for example in FIG. 1F. In accordance with the present invention, the second high k dielectric 22 is suitable for use with a pFET device. Illustrative examples of such dielectrics that can be used as the second high k dielectric 22 include, but are not limited to: $Al_2O_3$, AlON, AlN and combinations and multilayers thereof.

The second high k dielectric 22 is formed by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes including combinations thereof.

The physical thickness of the second high k dielectric 22 may vary, but typically, the second high k dielectric 22 has a thickness from about 0.5 to about 10 nm, with a thickness from about 0.5 to about 3 nm being more typical.

Figure 1G:
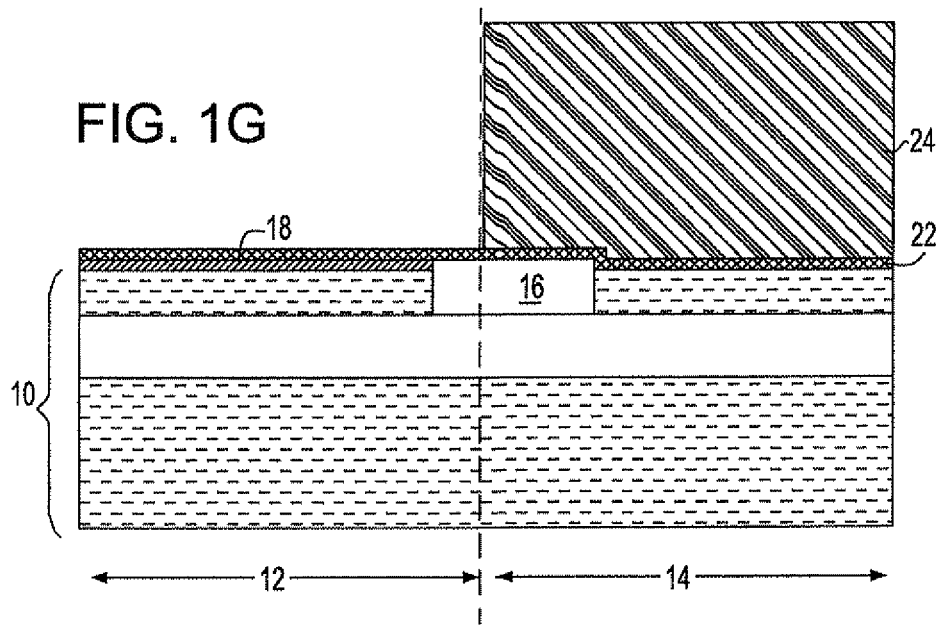

Next, and as shown in FIG. 1G, a second patterned block mask 24 is formed in the structure which protects the various layers present within the pFET device region 14. The second patterned block mask 24 is essentially the same as the patterned block mask 20 except that no ARC layer is employed. Hence, second patterned block mask 24 is comprised of one of the above mentioned block mask materials. The second patterned block mask 24 is processed as described above. In some embodiments, an adhesion layer (not shown) is present between the block mask material and a surface portion of the second high k dielectric within the pFET device region 14. An example of an adhesion layer is an alkoxysilane such as, for example, hexamethyldisilane (HMDS).

After providing the second patterned block mask 24 which protects the various layers within the pFET device region 14, the exposed second high k dielectric 22 present within the nFET device region 12 is removed utilizing a wet chemical etching process that selectively removes this dielectric material from the nFET device region 12. The choice of the exact chemical etchant may vary depending on the dielectric material to be removed and its selection can be determined by one skilled in the art. The resultant structure formed after removing the second high k dielectric 22 from within the nFET region 12 is shown, for example, in FIG. 1H.

Figure 1H:
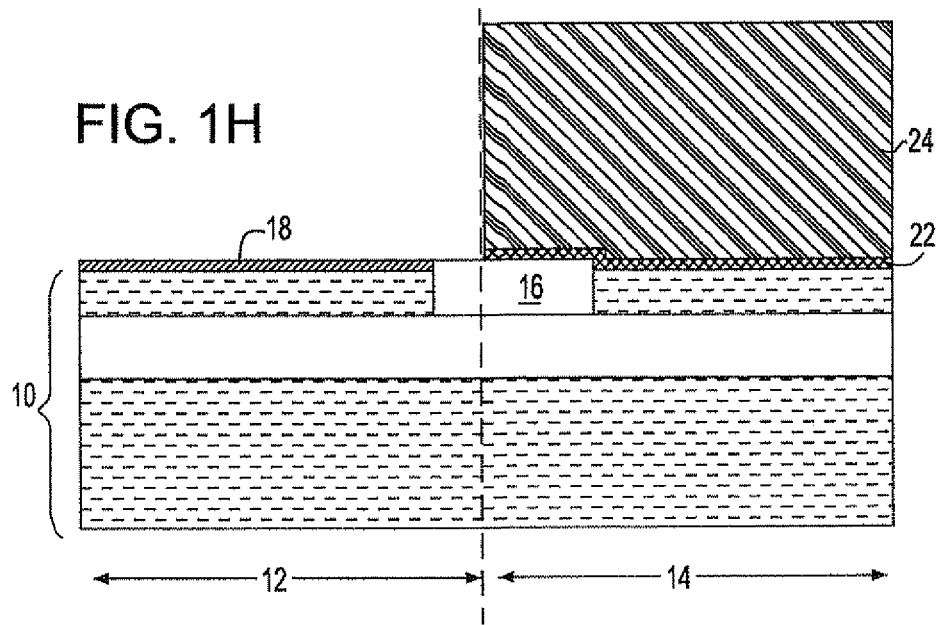
Figure 1I:
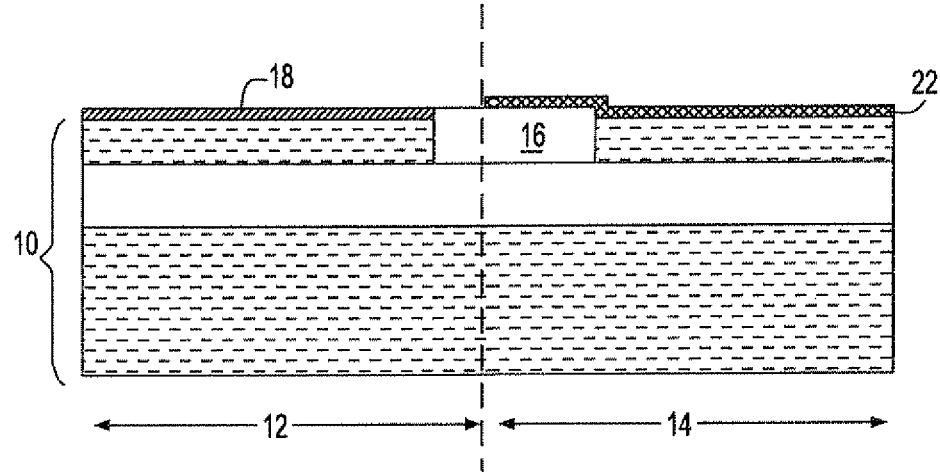

FIG. 1I shows the structure that is formed after the second patterned block mask 24 has been removed from the structure shown in FIG. 1H utilizing a conventional stripping process.

Figure 1J:
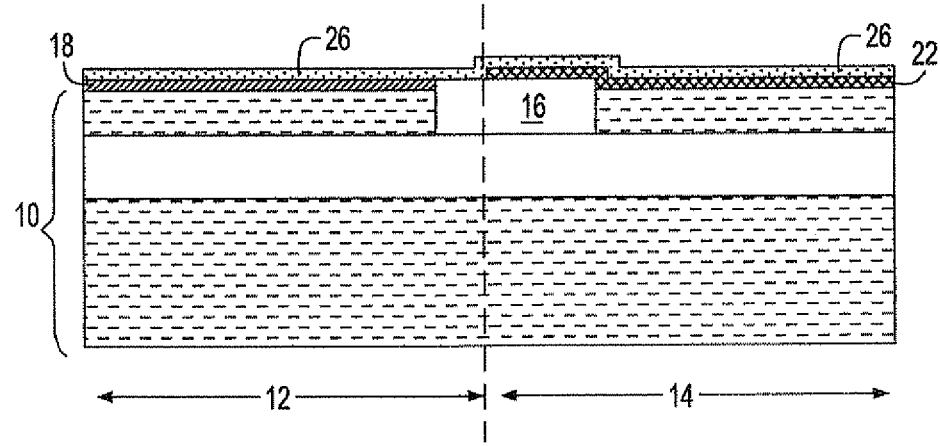

Next, and as is shown in FIG. 1J, a layer of an alkaline earth metal-containing material or a rare earth metal (or a rare earth-like) containing material 26 is then formed on the exposed surfaces of the first high k dielectric 18 within the nFET device region 12 and second high k dielectric 22 within the pFET device region 14 as well as atop the isolation region 16. The alkaline earth metal-containing material comprises a compound having the formula $M_xA_y$ wherein M is an alkaline earth metal (Be, Mg, Ca, Sr, and/or Ba), A is one of O, S or a halide, x is 1 or 2, and y is 1, 2 or 3. It is noted that the present invention contemplates alkaline earth metal-containing compounds that include a mixture of alkaline earth metals and/or a mixture of anions, such as $—OCl^{-2}$. Examples of alkaline earth metal-containing compounds that can be used in the present invention include, but are not limited to: MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in the present invention.

The alkaline earth metal-containing material is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes. The alkaline earth metal-containing material typically has a deposited thickness from about 0.1 nm to about 3.0 nm, with a thickness from about 0.3 nm to about 1.6 nm being more typical.

When a rare earth metal-containing layer is used as layer 26, the rare earth metal-containing layer comprises an oxide or nitride of at least one element from Group IIIB of the Periodic Table of Elements including, for example, La, Ce, Pr, Nd, Pm, Sm, Eu, Ga, Tb, Dy, Ho, Er, Tm, Yb, Lu or mixtures thereof. Preferably, the rare earth metal-containing layer comprises an oxide of La, Ce, Y, Sm, Er, and/or Tb, with $La_2O_3$ or LaN being most preferred.

The rare earth metal-containing layer is formed utilizing a conventional deposition process including, for example, evaporation, molecular beam deposition, MOCVD, ALD, PVP and other like deposition processes. In one embodiment of the present invention, the rare earth metal-containing layer is formed by placing the structure into the load-lock of a molecular beam deposition chamber, followed by pumping this chamber down to the range of $10^{-5}$ to $10^{-8}$ Torr. After these steps, the structure is inserted, without breaking vacuum into the growth chamber where the rare earth metal-containing layer such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1\times10^{-5}$ to $8\times10^{-5}$ Torr, and the La oxide growth rate can be in the range from 0.1 to 2 nm per minute, with a range from 0.5 to 1.5 nm being more typical.

The rare earth metal-containing layer typically has a thickness from about 0.1 nm to about 3.0 nm, with a thickness from about 0.3 nm to about 1.6 nm being more typical.

Figure 1K:
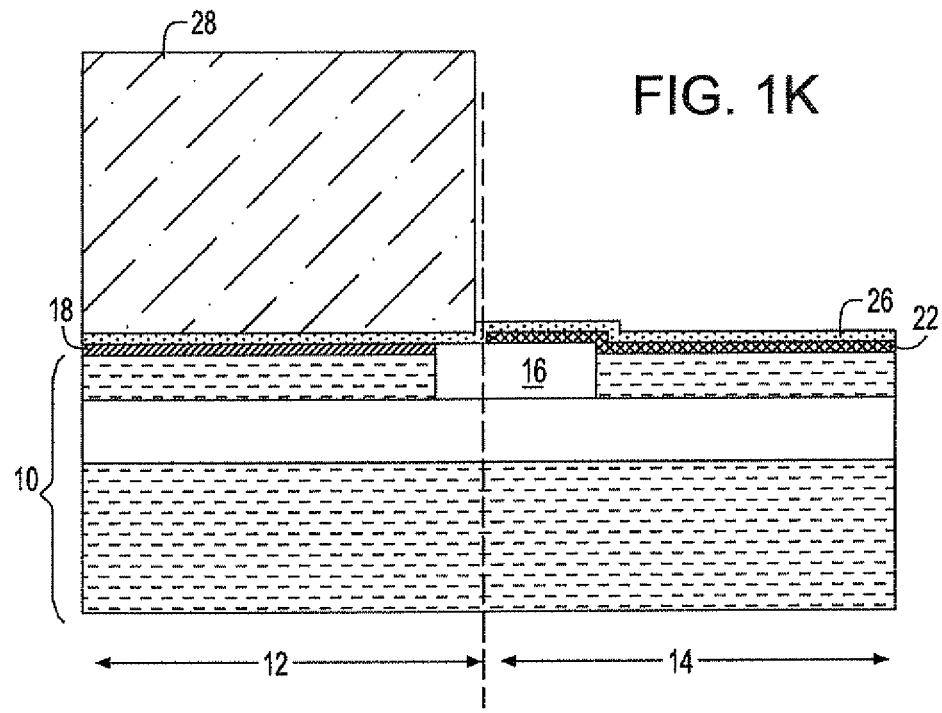

Next, and as shown in FIG. 1K, a third patterned block mask 28 is formed in the structure which protects the various layers present within the nFET device region 12. The third patterned block mask 28 is the same as the second patterned block mask 24. In some embodiments, an adhesion layer (not shown) is present between the block mask material and a surface portion of the first high k dielectric 18 within the nFET device region 12. An example of an adhesion layer is an alkoxysilane such as, for example, hexamethyldisilane (HMDS).

Figure 1L:
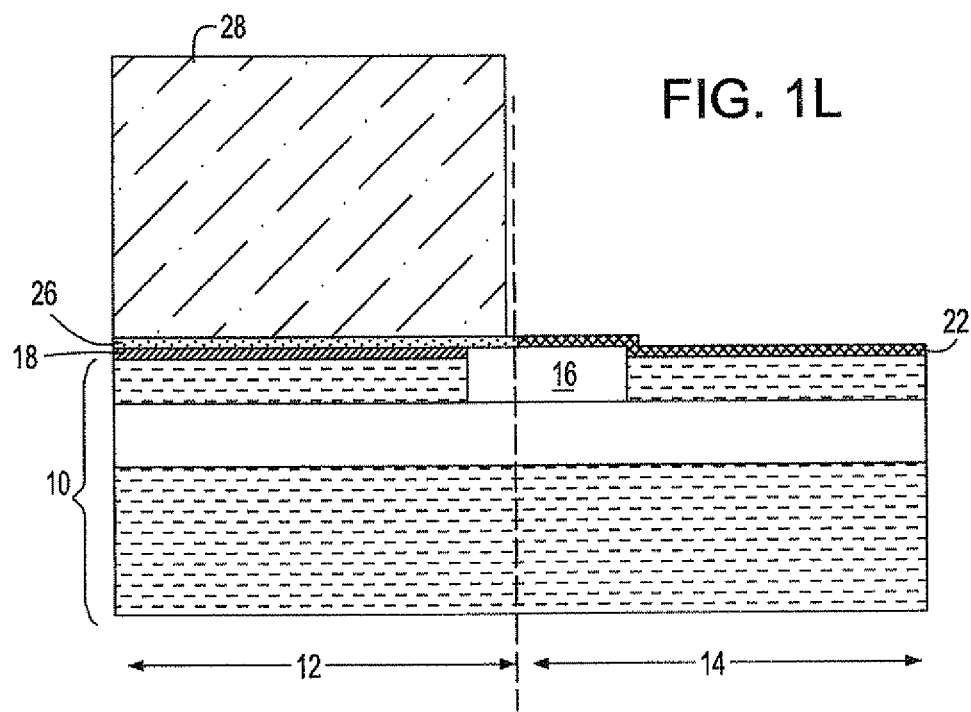

FIG. 1L shows the structure that is formed after removing layer 26 from within the pFET device region 14 utilizing an etching process that selectively removes exposed portions of material 26 within the pFET device region 14. It is noted that the presence of the alkaline earth metal-containing or rare earth metal-containing layer 26 within the nFET region 12 results in a dielectric stack (combination of layers 18 and 26) that includes no net negative charge. The dielectric stack within the pFET region (i.e., layer 22) has no net positive charge.

Figure 1M:
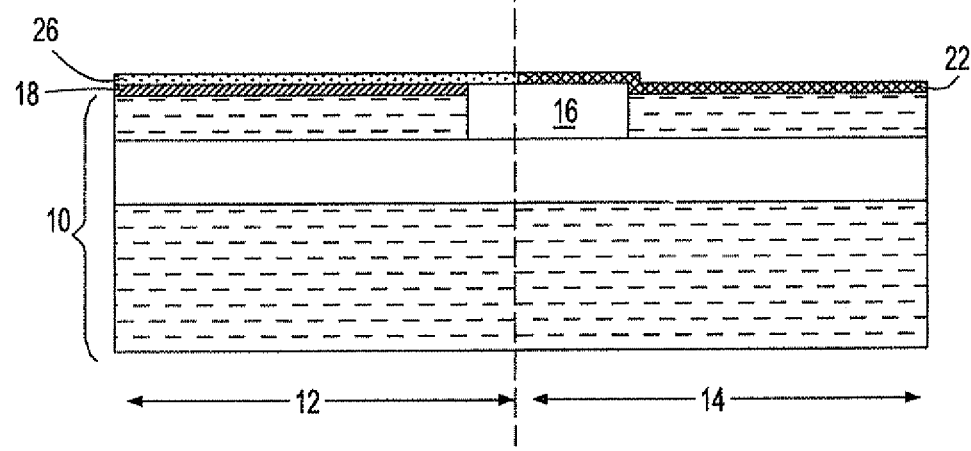

FIG. 1M shows the structure after removing the third patterned block mask within the nFET device region 12 utilizing a conventional stripping process. It should be noted that in the processing steps described above, the formation of the first and second dielectric stacks could be reversed from that which is specifically described and illustrated above.

Figure 1N:
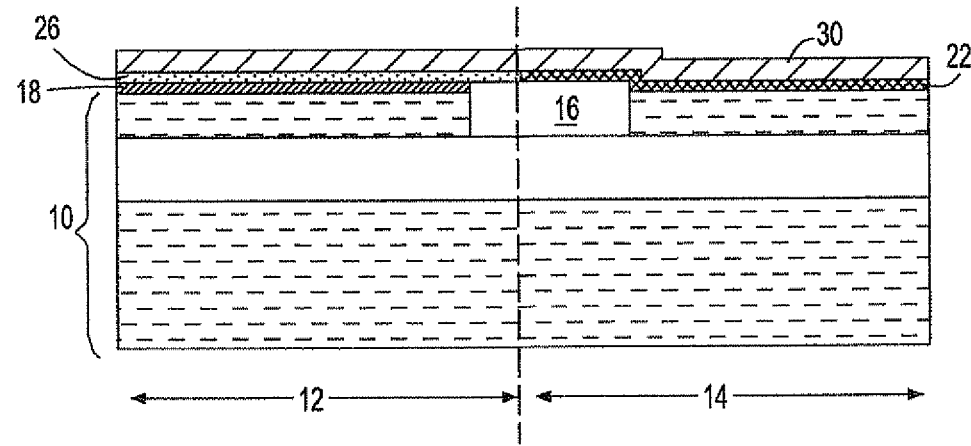

Next, and as shown in FIG. 1N, a first metal 30 is formed on all exposed surfaces of the structure shown in FIG. 1M utilizing a conventional deposition process. Examples of conventional depositions that can be used in forming the first metal 30 include, but are not limited to: CVD, PVD, ALD, sputtering or evaporation. The first metal 30 comprises a metallic material that is capable of conducting electrons. Specifically, the first metal layer 30 is a metal nitride or a metal silicon nitride. The first metal 30 comprises a metal from Group IVB or VB of the Periodic Table of Elements. Hence, the first metal 30 may include Ti, Zr, Hf, V, Nb or Ta, with Ti or Ta being highly preferred. By way of example, the first metal 30 preferably comprises TiN or TaN.

The physical thickness of the first metal 30 may vary, but typically, the first metal 30 has a thickness from about 0.5 to about 200 nm, with a thickness from about 5 to about 80 nm being more typical.

In one embodiment of the present invention, the first metal 30 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

As is shown in FIG. 1N, the structure includes a semiconductor substrate 10 including at least one nFET device region 12 and at least one pFET device region 14 which are separated by an isolation region 16. A first gate dielectric stack (combination of 18 and 26) having a net dielectric constant greater than silicon dioxide is located on a surface of the semiconductor substrate 10 and within the at least one nFET device region 12 and a second gate dielectric stack (defined by dielectric 22) having a dielectric constant greater than silicon dioxide is located on a surface of the substrate 10 and within the at least one pFET device region 14. In accordance with the present invention, the first gate dielectric stack (defined by layers 18 and 26) is different from the second gate dielectric stack (defined by layer 22) and the first gate dielectric stack contains no net negative charge and the second gate dielectric stack contains no net positive charge. The structure shown in FIG. 1N also includes a first metal 30 which is located on the first gate dielectric stack and the second gate dielectric stack. In accordance with the present invention, the first gate dielectric stack includes the first high k dielectric 18 and the alkaline earth metal-containing layer or rare earth metal-containing layer 26, while the second high k gate dielectric stack comprises the second high k dielectric 22. In some embodiments, the interfacial layer can be present in both dielectric stacks or only the gate dielectric stack in the nFET device region.

Following the formation of the first metal 30, a gate electrode 32 is formed atop the first metal 30. Specifically, a blanket layer of a conductive material is formed on the first metal 30 utilizing a known deposition process such as, for example, physical vapor deposition, CVD or evaporation. The conductive material used as the gate electrode 32 includes, but is not limited to: Si-containing materials such as Si or a SiGe alloy layer in either single crystal, polycrystalline or amorphous form. The gate electrode 32 may also be a conductive metal or a conductive metal alloy. Combinations of the aforementioned conductive materials are also contemplated herein. Si-containing materials are preferred as the gate electrode (or conductor) 32, with polySi being most preferred. In addition to aforementioned conductive materials, the present invention also contemplates instances wherein the conductor is fully silicided or a stack including a combination of a silicide and Si or SiGe. The silicide is made using a conventional silicidation process well known to those skilled in the art. Fully silicided gates can be formed using a conventional replacement gate process; the details of which are not critical to the practice of the present invention. The blanket layer of gate electrode 32 material may be doped or undoped. If doped, an in-situ doping deposition process may be employed in forming the same. Alternatively, a doped gate conductor can be formed by deposition, ion implantation and annealing. The ion implantation and annealing can occur prior to or after a subsequent etching step that patterns the material stack. The doping of the gate electrode 32 will shift the workfunction of the gate conductor formed. Illustrative examples of dopant ions for nFETs include elements from Group VA of the Periodic Table of Elements, while Group IIIA elements can be used when pFETs are formed. The thickness, i.e., height, of the gate electrode 32 deposited at this point of the present invention may vary depending on the deposition process employed. Typically, the gate electrode 32 has a vertical thickness from about 20 to about 180 nm, with a thickness from about 40 to about 150 nm being more typical.

Figure 2:
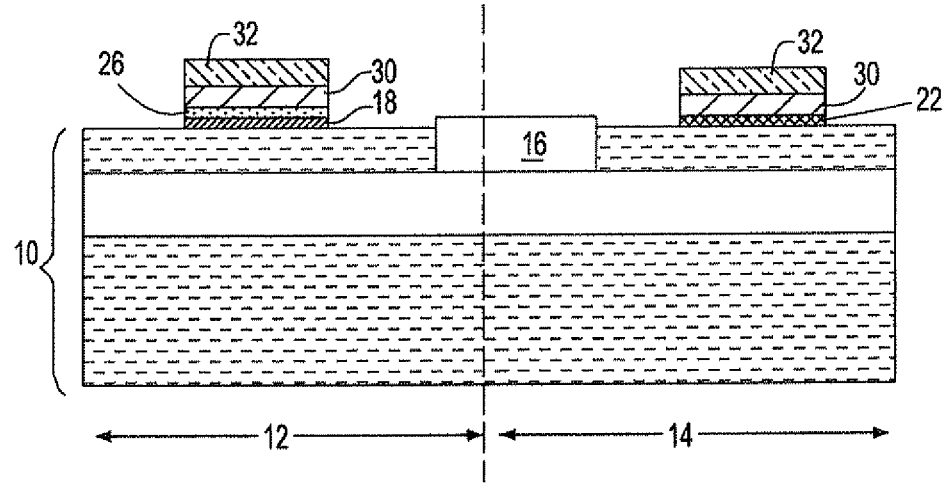
FIG. 2 is a pictorial representation (through a cross sectional view) depicting the structure of FIG. 1N after forming a gate electrode atop the single gate metal and patterning the various material layers into gate stacks.

Next, the gate stacks are formed by lithography and etching of the material layers described above. The resultant structure that is formed after gate stack formation is shown, for example, in FIG. 2.

Following patterning of the material stack, at least one spacer (not shown) is typically, but not always, formed on exposed sidewalls of each patterned material stack. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed) do not encroach underneath the edges of the patterned material stack. Typically, the source/drain silicide does not encroach underneath the edges of the patterned material stack when the at least one spacer has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions (also not shown) are then formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 500° to 550° C. for interfacial layer/semiconductor substrate interface state passivation.

Further CMOS processing such as formation of silicided contacts (source/drain and gate) as well as formation of BEOL (back-end-of-the-line) interconnect levels with metal interconnects can be formed utilizing processing steps that are well known to those skilled in the art.

Figure 3:
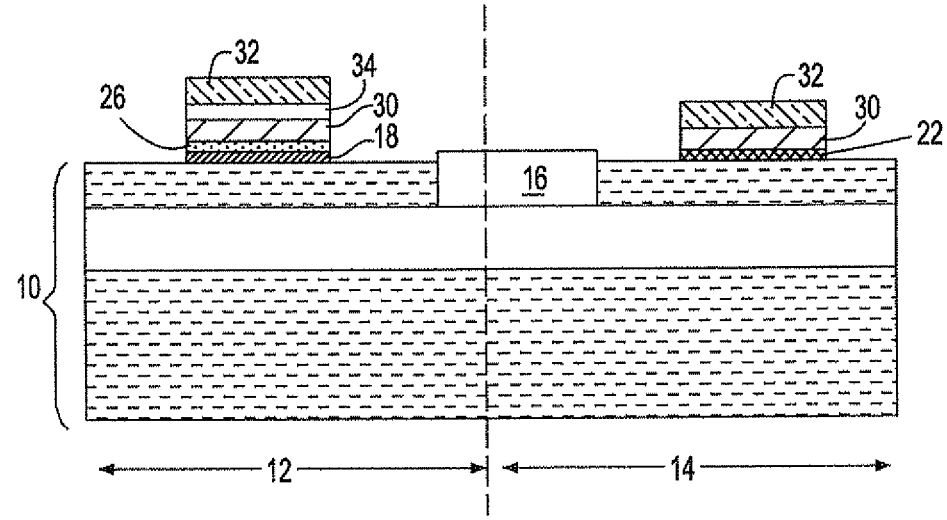
FIG. 3 is a pictorial representation (through a cross sectional view) depicting an alternative structure of the present invention which includes a gate stack comprising a first metal layer, a workfunction defining metal, and a gate electrode in the nFET device region, and a gate stack comprising the first metal layer and the Si-containing electrode in the pFET device region.
Figure 4:
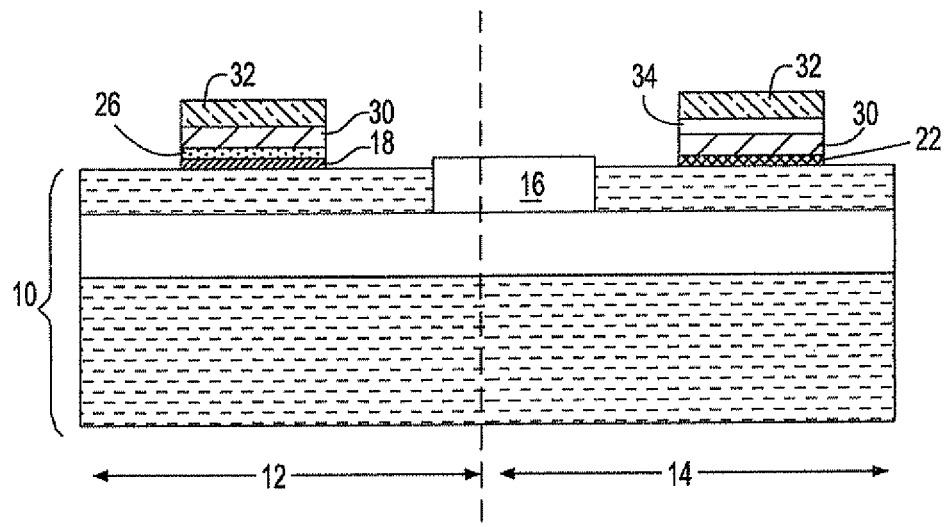
FIG. 4 is a pictorial representation (through a cross sectional view) depicting another alternative structure of the present invention which includes a gate stack comprising a first metal layer, a workfunction defining metal, and a gate electrode in the pFET device region, and a gate stack comprising the first metal layer and the gate electrode in the nFET device region.

FIGS. 3 and 4 shows other embodiments of the present invention in which a workfunction defining metal 34 is present within one of the device regions between the first metal 30 and the gate electrode 32. By "workfunction defining metal" it is meant a metal layer that can be used to adjust or set the workfunction of the gate stack. For n-type workfunctions, the workfunction defining metal 34 comprises at least one element from Groups IIIB, IVB or VB of the Periodic Table of Elements (the nomenclature of the elements is based on the CAS version). Elements within the Lanthanide Series (e.g., La, Ce, Pr, Nd, Pm, Sm, Eu, Gd, Tb, Dy, Ho, Er, Tm, Yb or Lu) also contemplated herein. Illustrative examples of metal that can be used in providing an n-type workfunction to a conductive electrode comprise, but are not limited to: Sc, Y, La, Zr, Hf, V, Nb, Ta, Ti and elements from the Lanthanide Series. Preferably, the workfunction defining metal used in providing the n-type workfunction shift is one of elements from the Lanthanide group. For p-type workfunctions, the workfunction defining metal 34 comprises at least one element from Groups VIB, VIIB and VIII of the Periodic Table of Elements (the nomenclature of the elements is based on the CAS version). Illustrative examples of metals that can be used in providing a p-type workfunction to a conductive electrode comprise, but are not limited to: Re, Fe, Ru, Co, Rh, Ir, Ni, Pd, and Pt. Preferably, the workfunction defining metal 34 used in providing the p-type workfunction shift is one of Re, Ru or Pt.

The workfunction defining metal 34 is formed by a conventional deposition process such as, for example, chemical vapor deposition, plasma enhanced chemical vapor deposition, sputtering, plating, chemical solution deposition and the like. The workfunction defining metal 34 is then patterned by lithography and etching is used to remove the workfunction defining metal 34 from one of the device regions providing the structure shown in either FIG. 3 or 4. The workfunction defining metal 34 typically has a thickness from about 2 to about 80 nm, with a thickness of about 10 nm being even more typical.

The structures shown in FIGS. 3 and 4 can be processed as described above in forming gate stack regions, spacers, etc. within each of the device regions.

Reference is now made to FIGS. 5A-5L which illustrate a process flow of the present invention in which the nFET device region 12 includes a metal/metal gate stack. Although this specific processing flow is shown, the same can be altered to form a metal/metal gate stack within the pFET device region 14.

Figure 5A:
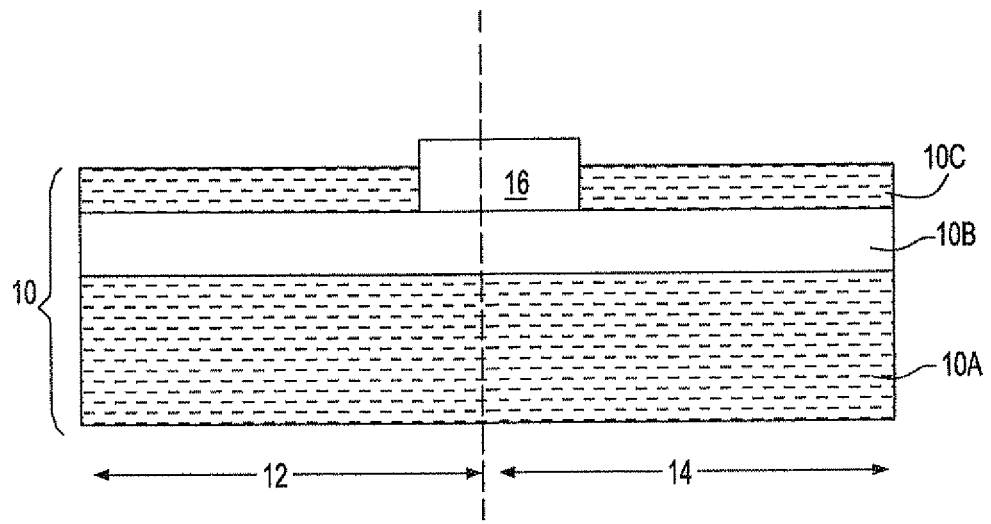
FIGS. 5A-5L are pictorial representations (through cross sectional views) depicting an alternative process flow of the present invention in which a metal/metal gate stack is used.

FIG. 5A shows an initial structure that is employed in the present invention. It is noted that the initial structure 5A includes the same components as described above in regard to FIG. 1A. That is, the initial structure shown in FIG. 5A includes a semiconductor substrate 10 comprising at least one nFET device region 12 and at least one pFET device region 14 that are separated by an isolation region 16. As described above, the semiconductor substrate 10 may comprise a bulk semiconductor (not specifically shown) or a semiconductor-on-insulator (as shown) that includes top semiconductor layer 10C, buried insulating layer 10B and bottom semiconductor layer 10A.

Although not shown, the initial structure may optionally include an interfacial layer on the surface of the semiconductor substrate 10 shown in FIG. 5A at this point of the present invention. In some embodiments of the present invention, the structure may alternatively include a thick sacrificial $SiO_2$ (on the order of about 3 to about 10 nm) that serves to protect one or both device channel regions during the high k dielectric removal process. This sacrificial $SiO_2$ layer will be removed just prior to the formation of the high k material by a suitable etch chemistry that is selective to the underlying device channel region.

Figure 5B:
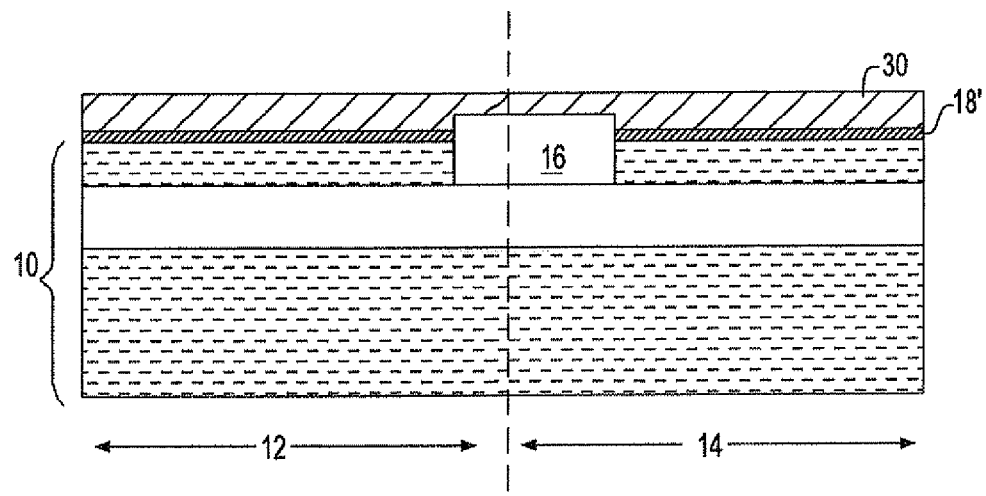

Next, a first high k dielectric (as described above) is formed on the surface of the initial structure shown in FIG. 5A, followed by a layer of an alkaline earth metal-containing material or a rare earth metal (or a rare earth-like) containing material (as described above) and a first metal 30 (as described above). In these drawings, reference numeral 18' is used in describing the first high k dielectric and the layer an alkaline earth metal-containing material or a rare earth metal (or a rare earth-like) containing material. The structure including the stack of first high k dielectric an alkaline earth metal-containing material or a rare earth metal (or a rare earth-like) containing material 18' and the first metal 30 is shown in FIG. 5B.

Figure 5C:
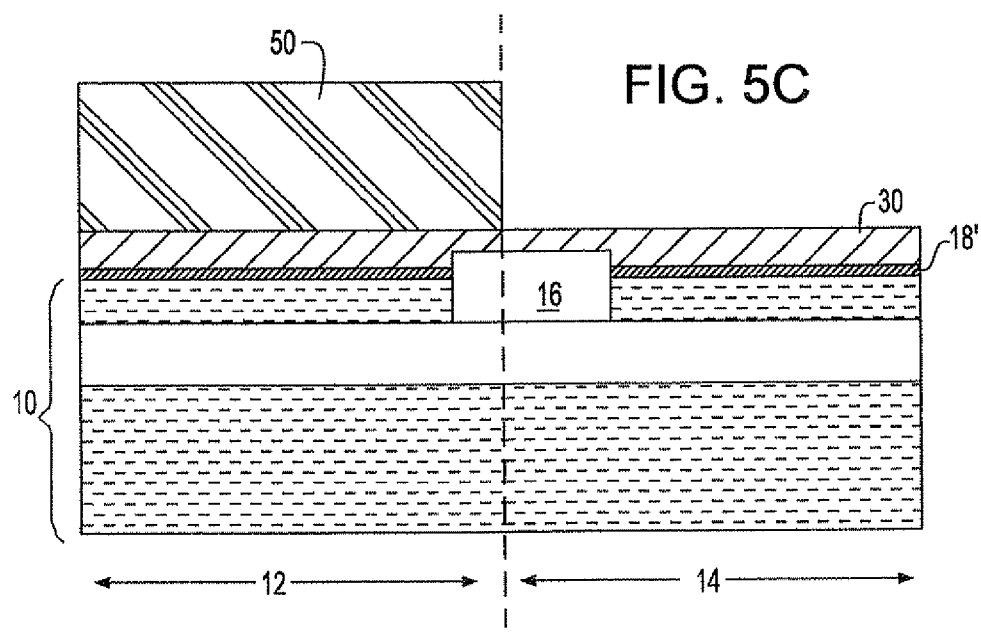

Next, and as shown in FIG. 5C, a patterned first block mask 50 is formed protecting the nFET device region 12, while leaving the material stacks within the pFET device region 14 exposed. The first patterned block mask 50 comprises a conventional resist material, which may optional include an ARC coating and it is formed by conventional techniques, including deposition and lithography, that are well known in the art.

Figure 5D:
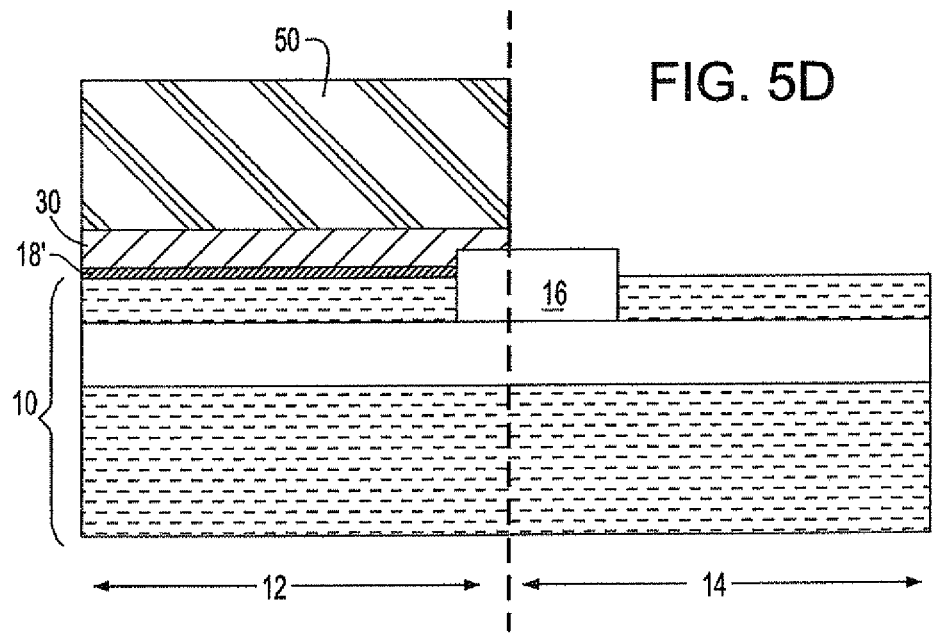

After protecting one of the device regions, the material stack atop of substrate 10 is then removed providing, for example, the structure shown in FIG. 5D. Specifically, FIG. 5D shows the structure that is formed after removing the first metal 30, and the dielectric stack 18' of the layer of an alkaline earth metal-containing material or a rare earth metal (or a rare earth-like) containing material and the first high k dielectric from the pFET device region 14. In accordance with the present invention, one or more etching (dry, wet or any combination of said etching techniques) can be used to remove the material stack atop the substrate 10 in the pFET device region 14. In one embodiment, a dry etching process is used to remove the first metal 30 from the pFET device region 14, and the same or a different dry etching process is used to remove the dielectric stack 18' from the pFET device region 14.

Figure 5E:
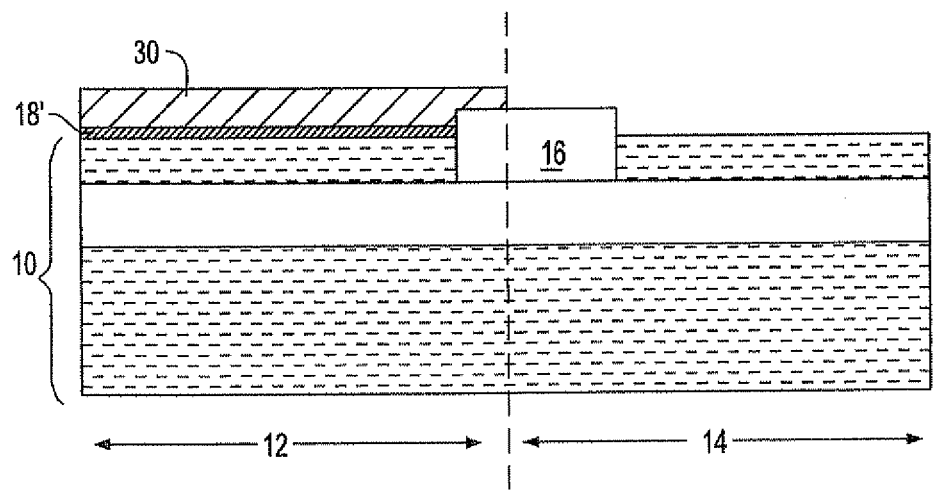

After providing the structure in which the material stack is removed from one of the device regions, the first patterned block mask 50 is removed from the structure utilizing a conventional stripping process well known in the art. FIG. 5E illustrates one such structure that is formed after stripping the first patterned block mask 50 therefrom. At this point of the present invention, an interfacial layer (not shown) can optionally be formed.

Figure 5F:
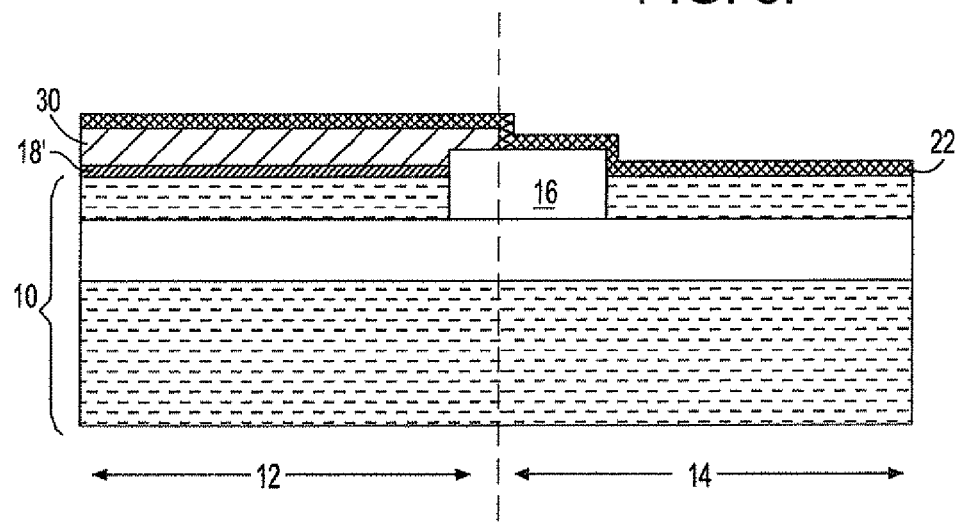
Figure 5G:
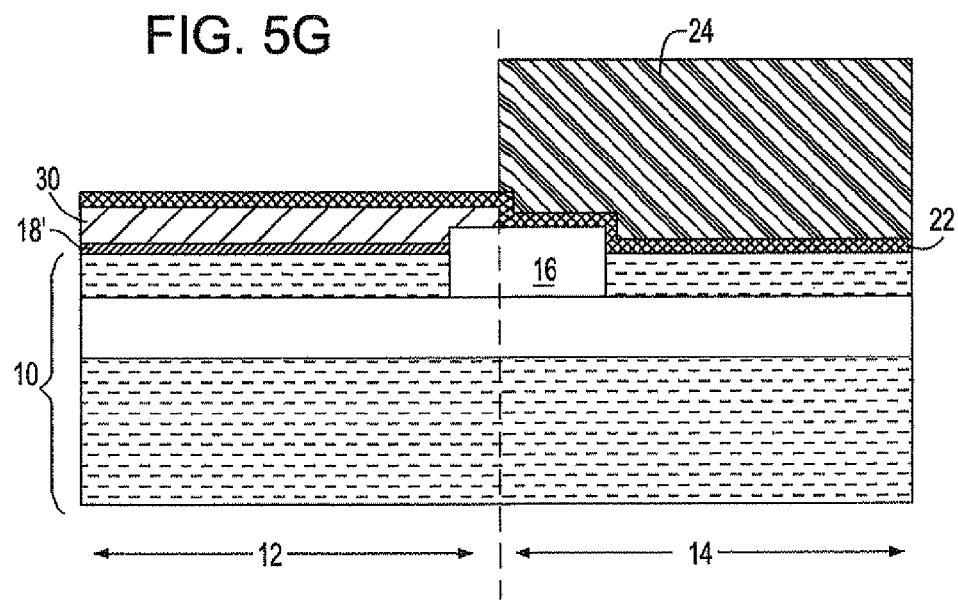

Next, and as shown in FIG. 5F, a second high k dielectric 22 (as described above) is formed. FIG. 5G shows the formation of a second patterned block mask 24 (as described above) in the pFET device region 14. It is noted that this structure shown in FIG. 5G represents one embodiment, and that the second patterned block mask can be formed in the nFET region, instead of the pFET region as shown. In the specific embodiment shown, second high k dielectric layer 22, within the nFET device region 12 is exposed.

Figure 5H:
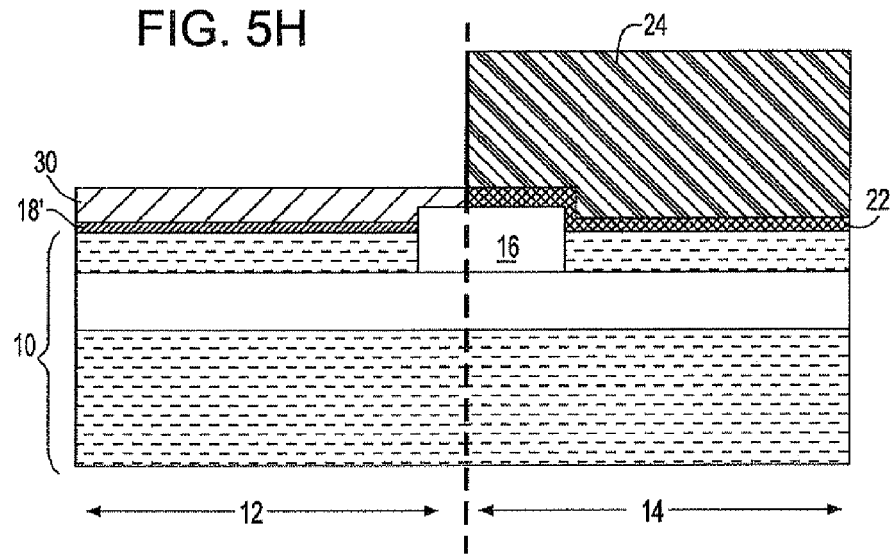

After forming the second patterned block mask 24 within the desired device region, the exposed portion of the second high k dielectric 22 is removed utilizing a selective etching process which includes an etchant that is capable of removing layer 22, stopping on first metal 30. The resultant structure for the illustrated embodiment is shown in FIG. 5H.

Figure 5I:
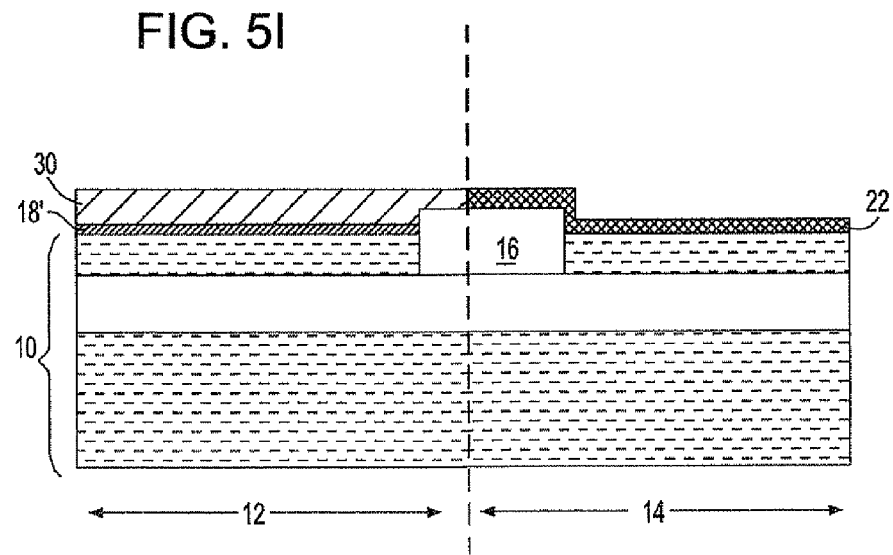
Figure 5J:
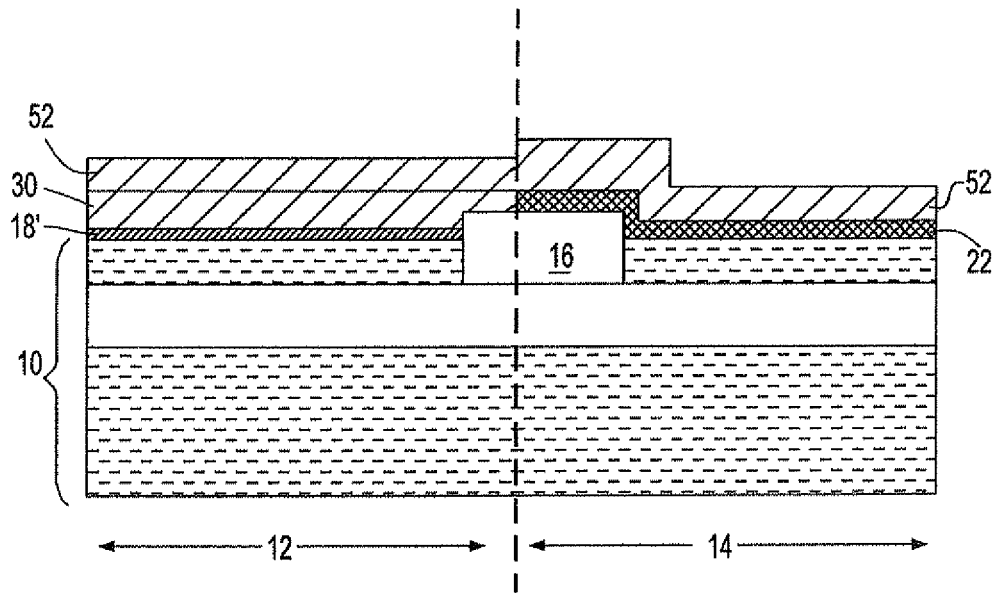

FIG. 5I shows the structure after removing the second patterned block mask 24 from the structure utilizing a conventional stripping process well known to one skilled in the art. A second metal 52, which may comprise the same or different metal as the first metal 30 in then formed utilizing the techniques described above for forming first metal 30 (see, the structure shown, for example, in FIG. 5J). In one embodiment, the first and second metals (layers 30 and 52) are comprised of TiN.

Figure 5K:
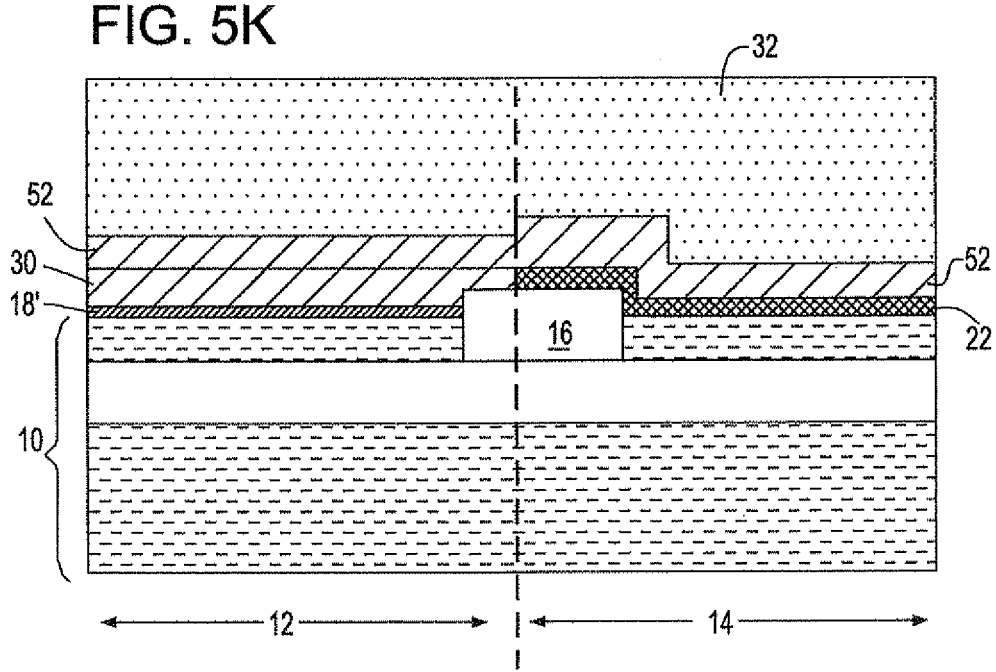
Figure 5L:
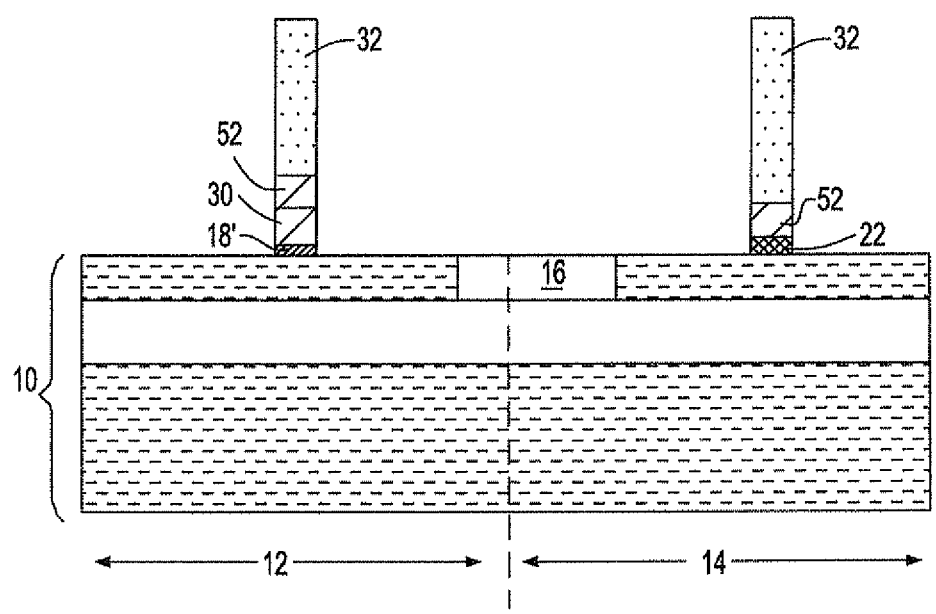

FIG. 5K shows the structure after forming gate electrode 32 (as described above) atop the second metal 52 and FIG. 5L shows the structure after patterning the material layers within each of the device regions. In the specific embodiment illustrated, the gate stack within the nFET device region comprises dielectric stack 18', first metal 30, second metal 52, and gate electrode 32, while the gate stack within the pFET device region 14 comprises second high k dielectric 22, second metal 52 and gate electrode 32. In some embodiments, the gate stack in the nFET device region, would include dielectric stack 18', second metal 52, and gate electrode 32, while the gate stack in the pFET device region 14 would include second high k dielectric 22, first metal 30, second metal 52 and gate electrode 52. This embodiment is achieved by alternating the block mask shown in FIG. 5C so that is protecting the pFET device region 14, instead of the nFET device region 12. Further device processing, as described above can be also performed on the structure shown in FIG. 5L. It is noted that the gate stacks are engineered as described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    a semiconductor substrate including at least one nFET device region and at least one pFET device region, said device regions are separated by an isolation region;
    a first gate dielectric stack having a net dielectric constant greater than silicon dioxide located on a surface of said substrate and within said at least one nFET device region, wherein the first gate dielectric stack comprises a hafnium (Hf)-based dielectric layer on the semiconductor substrate and a layer of an alkaline earth metal-containing compound directly on the hafnium (Hf)-based dielectric layer, wherein the alkaline earth metal-containing compound is selected from the group consisting of MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, $BaI_2$, and combination thereof;
    a second gate dielectric stack having a net dielectric constant greater than silicon dioxide located on a surface of said substrate and within said at least one pFET device region, wherein said second gate dielectric stack includes an aluminum containing dielectric layer, and wherein said first gate dielectric stack contains no net negative charge and said second gate dielectric stack contains no net positive charge;
    a first metal layer located on said first gate dielectric stack and said second gate dielectric stack; and
    a workfunction defining metal layer located on said first metal layer in one of said device regions, wherein in said at least one nFET device an nFET gate stack is provided that has a band edge workfunction and wherein in said at least one pFET device region a pFET gate stack is provided that has a ¼ gap workfunction.

2. The semiconductor structure of claim 1 wherein said Hf-based dielectric layer is selected from $HfO_2$, $HfSiO_x$, Hf silicon oxynitride and multilayers thereof.

3. The semiconductor structure of claim 1 wherein said aluminum containing dielectric layer includes $Al_2O_3$ or AlN.

4. The semiconductor structure of claim 1 wherein said first metal layer comprises a metal nitride or a metal silicon nitride, wherein said metal is from Group IVB or VB of the Periodic Table of Elements.

5. The semiconductor structure of claim 1 further comprising a gate electrode atop said both said first metal layer and said workfunction defining metal layer.

6. The semiconductor structure of claim 1 wherein said workfunction defining metal is located within said at least one nFET device region and includes at least one element from Groups IIIB, IVB, VB or Lanthanide Series of the Periodic Table of Elements.

7. The semiconductor structure of claim 1 wherein and said workfunction defining metal is located within said at least one pFET device region and includes at least one element from Groups VIB, VIIB or VIII of the Periodic Table of Elements.

8. A semiconductor structure comprising:
    a semiconductor substrate including at least one nFET device region and at least one pFET device region, said device regions are separated by an isolation region;
    a first gate dielectric stack having a net dielectric constant greater than silicon dioxide located on a surface of said substrate and within said at least one nFET device region, wherein said first dielectric stack includes, from bottom to top, a first high-k dielectric and an alkaline earth metal-containing layer having a different composition than said first high-k gate dielectric, wherein the alkaline earth metal-containing from the group consisting of MgO, MgS, MgF$_2$, MgCl$_2$, MgBr$_2$, MgI$_2$, CaO, CaS, CaF$_2$, CaCl$_2$, CaBr$_2$, CaI$_2$, SrO, SrS, SrF$_2$, SrCl$_2$, SrBr$_2$, SrI$_2$, BaO, BaS, BaF$_2$, BaCl$_2$, BaBr$_2$, BaI$_2$, and combination thereof;

a second gate dielectric stack having a net dielectric constant greater than silicon dioxide located on a surface of said substrate and within said at least one pFET device region, wherein said first high k dielectric and said second gate dielectric stack have different compositions;

a first metal layer located on said first gate dielectric stack and said second gate dielectric stack; and a workfunction defining metal layer located on said first metal layer in one of said device regions.

* * * * *